US011131895B2

(12) United States Patent
Tanaka

(10) Patent No.: US 11,131,895 B2
(45) Date of Patent: Sep. 28, 2021

(54) DISPLAY DEVICE

(71) Applicant: Sharp Kabushiki Kaisha, Sakai (JP)

(72) Inventor: Kohhei Tanaka, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 76 days.

(21) Appl. No.: 16/810,979

(22) Filed: Mar. 6, 2020

(65) Prior Publication Data

US 2020/0285090 A1 Sep. 10, 2020

Related U.S. Application Data

(60) Provisional application No. 62/815,403, filed on Mar. 8, 2019.

(51) Int. Cl.
*G02F 1/1368* (2006.01)
*G02F 1/1362* (2006.01)
(Continued)

(52) U.S. Cl.
CPC ........ *G02F 1/1368* (2013.01); *G02F 1/13338* (2013.01); *G02F 1/13439* (2013.01); *G02F 1/133345* (2013.01); *G02F 1/134309* (2013.01); *G02F 1/136227* (2013.01); *G02F 1/136286* (2013.01); *H01L 27/322* (2013.01); *H01L 27/323* (2013.01); *H01L 27/3248* (2013.01); *H01L 27/3258* (2013.01); *H01L 27/3276* (2013.01); *H01L 51/5206* (2013.01); *G02F 1/136222* (2021.01); *G02F 2201/121* (2013.01);
(Continued)

(58) Field of Classification Search
CPC ............ G02F 1/1368; G02F 1/133345; G02F 1/13338; G02F 1/134309; G02F 1/13439; G02F 1/136227; G02F 1/136286; G02F 1/136222; G02F 2201/121; G02F 2202/10; H01L 27/322; H01L 27/323; H01L 27/3248; H01L 27/3258; H01L 27/3276; H01L 51/5206; H01L 27/1225; H01L 27/124; H01L 27/1248; H01L 29/24; H01L 29/7869
USPC .................................. 349/106–109
See application file for complete search history.

(56) References Cited

U.S. PATENT DOCUMENTS 6,031,512 A 2/2000 Kadota et al.
2016/0291377 A1 * 10/2016 Kosuge ............... G02F 1/13439

FOREIGN PATENT DOCUMENTS

JP 11-24061 A 1/1999

* cited by examiner

*Primary Examiner* — Charles S Chang
(74) *Attorney, Agent, or Firm* — Keating & Bennett, LLP

(57) ABSTRACT

A display device includes: an active matrix substrate including pixels arrayed in a matrix shape including rows and columns, and scanning wiring lines extending in a row direction and signal wiring lines extending in a column direction, wherein the active matrix substrate includes, in each of pixels, a TFT, a pixel electrode formed of a transparent conductive material and electrically connected to the TFT, a color filter located between the TFT and the pixel electrode, and a connecting electrode formed of a transparent conductive material and electrically connecting the TFT to the pixel electrode, the color filter includes a first color filter layer provided on the TFT and including a first contact hole, and a second color filter layer provided on the first color filter layer and including a second contact hole, and the first contact hole and the second contact hole do not overlap with each other.

15 Claims, 19 Drawing Sheets

(51) Int. Cl.
  *G02F 1/1333* (2006.01)
  *G02F 1/1343* (2006.01)
  *H01L 27/32* (2006.01)
  *H01L 51/52* (2006.01)
  *H01L 27/12* (2006.01)
  *H01L 29/24* (2006.01)
  *H01L 29/786* (2006.01)
(52) U.S. Cl.
  CPC ........ *G02F 2202/10* (2013.01); *H01L 27/124* (2013.01); *H01L 27/1225* (2013.01); *H01L 27/1248* (2013.01); *H01L 29/24* (2013.01); *H01L 29/7869* (2013.01)

DISPLAY DEVICE

CROSS-REFERENCE TO RELATED APPLICATION

The present application claims priority from Provisional Application 62/815,403, the content to which is hereby incorporated by reference into this application.

BACKGROUND OF THE INVENTION

1. Field of the Invention

The present disclosure relates to a display device, particularly a display device provided with an active matrix substrate including a color filter.

2. Description of the Related Art

In a typical liquid crystal display device, a color filter is provided on a counter substrate facing an active matrix substrate. Thus, the counter substrate may be referred to as a color filter substrate.

In recent years, an increase in the definition of liquid crystal display devices has progressed. In particular, liquid crystal display devices for Head Mounted Displays (HMD) are required to have very high definition since the display screen is enlarged by a lens and viewed. Since such an ultra-high definition liquid crystal display device has a small pixel pitch, in a case where a color filter is provided on the counter substrate, a problem arises that a color deviation is likely to occur when a bonding deviation occurs. Therefore, a bonding deviation needs to be reduced as much as possible, but this may lead to a decrease in yield.

A structure in which a color filter is provided on an active matrix substrate (referred to as a "color filter-on-array (COA) structure") has been proposed as a structure that can prevent a color deviation caused by a bonding deviation. The COA structure is disclosed in Japanese Unexamined Patent Application Publication No. Heisei 11-24061A, for example.

SUMMARY OF THE INVENTION

However, as a result of detailed research conducted by the inventors of the present application on the application of the COA structure to ultra-high definition liquid crystal display devices, it has been ascertained that a new problem that an aperture ratio decreases due to the application of the COA structure may arise. This problem is attributable to the need to form contact holes in color filters for electrically connecting a thin film transistor (TFT) to a pixel electrode in each pixel, as will be described in detail below.

In addition, even in a bottom-emitting organic EL display device, there is a demand for further improvement in an aperture ratio.

In light of the above problems, an object of the present disclosure is to improve an aperture ratio of a display device provided with an active matrix substrate including a color filter.

The present disclosure discloses a display device according to the following items.

Item 1

A display device includes an active matrix substrate including a plurality of pixels arrayed in a matrix shape including a plurality of rows and a plurality of columns and a plurality of scanning wiring lines extending in a row direction and a plurality of signal wiring lines extending in a column direction. The active matrix substrate includes, in each of the plurality of pixels, a TFT including a semiconductor layer, a gate electrode, a source electrode, and a drain electrode, a pixel electrode formed of a transparent conductive material and electrically connected to the TFT, a color filter located between the TFT and the pixel electrode, and at least one connecting electrode formed of a transparent conductive material and electrically connecting the TFT to the pixel electrode, the color filter includes a first color filter layer provided on the TFT and including a first contact hole and a second color filter layer provided on the first color filter layer and including a second contact hole, and the first contact hole and the second contact hole do not overlap with each other when viewed in a normal direction of a display surface.

Item 2

The display device according to Item 1, wherein the at least one connecting electrode is one connecting electrode connecting the TFT to the pixel electrode, the TFT is connected to the connecting electrode in the first contact hole, and the connecting electrode is connected to the pixel electrode in the second contact hole.

Item 3

The display device according to Item 2, wherein the drain electrode of the TFT is formed of a metal material, and the drain electrode of the TFT is connected to the connecting electrode in the first contact hole.

Item 4

The display device according to Item 2, wherein the semiconductor layer of the TFT is an oxide semiconductor layer, the drain electrode of the TFT is a transparent drain electrode integrally formed with the connecting electrode, the active matrix substrate includes an interlayer insulating layer covering the oxide semiconductor layer and the gate electrode, the interlayer insulating layer includes a third contact hole continuous with the first contact hole, and the transparent drain electrode is connected to the oxide semiconductor layer in the third contact hole.

Item 5

The display device according to Item 4, wherein, when viewed in the normal direction of the display surface, a transparent electrode layer including the transparent drain electrode and the connecting electrode at least partially overlaps one of the plurality of signal wiring lines.

Item 6

The display device according to Item 4 or 5, wherein the oxide semiconductor layer includes an In—Ga—Zn—O-based semiconductor.

Item 7

The display device according to Item 6, wherein the In—Ga—Zn—O-based semiconductor includes a crystalline portion.

Item 8

The display device according to any one of Items 1 to 7, wherein, in a case where a region surrounded by two adjacent scanning wiring lines of the plurality of scanning wiring lines and two adjacent signal wiring lines of the plurality of signal wiring lines is referred to as a pixel opening region, the second contact hole is located within the pixel opening region.

Item 9

The display device according to Item 8, wherein a thickness of the second color filter layer is less than a thickness of the first color filter layer.

Item 10

The display device according to any one of Items 1 to 7, wherein the second contact hole at least partially overlaps one of the plurality of scanning wiring lines when viewed in the normal direction of the display surface.

Item 11

The display device according to Item 10 according to Item 4, wherein a thickness of the second color filter layer is greater than a thickness of the first color filter layer.

Item 12

The display device according to any one of Items 1 to 11, wherein the display device functions as an in-cell touch panel, the active matrix substrate further includes a plurality of sensor wiring lines for a touch panel, the plurality of sensor wiring lines for a touch panel being formed of a metal material and provided between the first color filter layer and the second color filter layer, and when viewed in the normal direction of the display surface, the plurality of sensor wiring lines for a touch panel overlap the plurality of signal wiring lines.

Item 13

The display device according to Item 12, wherein the active matrix substrate further includes a common electrode formed of a transparent conductive material and divided into a plurality of sub-electrodes, and each of the plurality of sensor wiring lines for a touch panel is electrically connected to one of the plurality of sub-electrodes.

Item 14

The display device according to any one of Items 1 to 13, wherein the display device is a liquid crystal display device further including a counter substrate facing the active matrix substrate and a liquid crystal layer provided between the active matrix substrate and the counter substrate.

Item 15

The display device according to any one of Items 1 to 13, wherein the display device is an organic EL display device further including an organic EL layer provided on the pixel electrode.

According to an embodiment of the present invention, an aperture ratio of a display device provided with an active matrix substrate including a color filter can be improved.

DETAILED DESCRIPTION OF THE INVENTION

Hereinafter, embodiments of the present invention will be described with reference to the accompanying drawings.

First Embodiment

Figure 1:
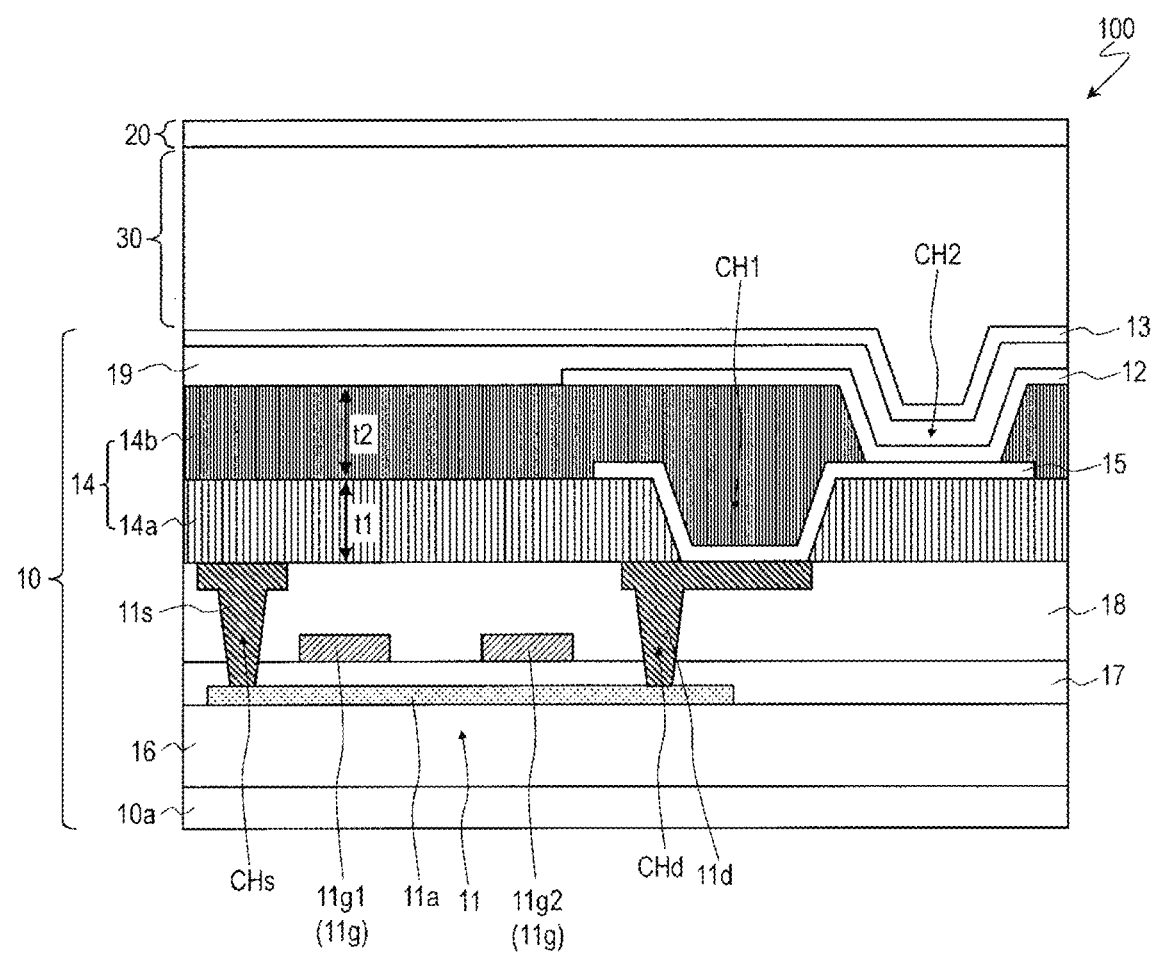
FIG. 1 is a cross-sectional view schematically illustrating a liquid crystal display device 100 according to an embodiment of the present invention, illustrating a cross-sectional structure along a line 1A-1A' in FIG. 2.
Figure 2:
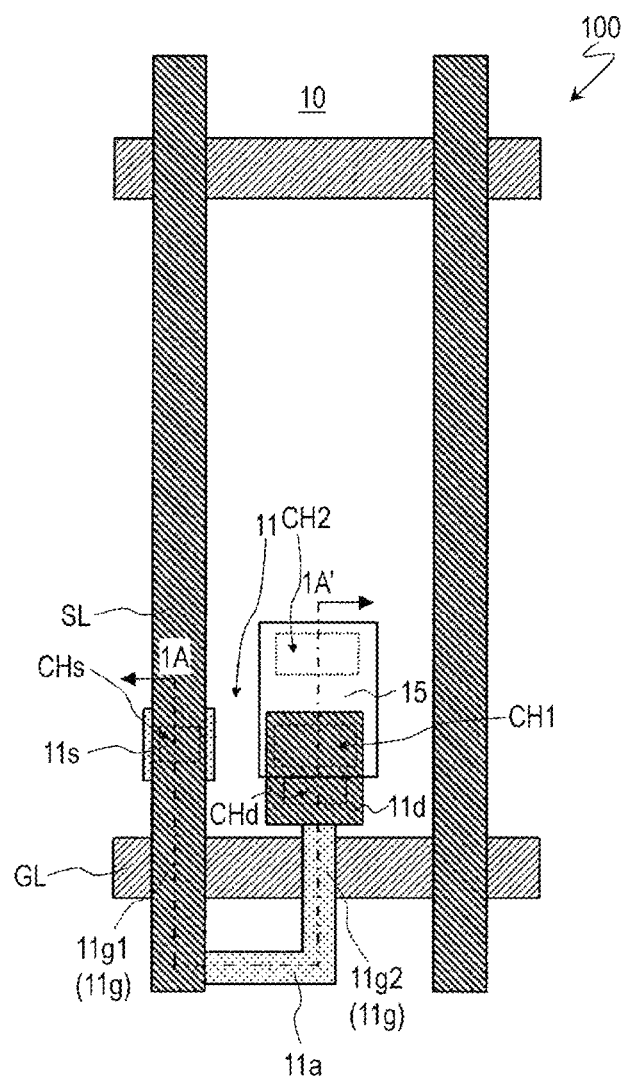
FIG. 2 is a plan view schematically illustrating the liquid crystal display device 100, illustrating a region corresponding to one pixel.

A liquid crystal display device 100 according to the present embodiment will be described with reference to FIGS. 1 and 2. FIGS. 1 and 2 are a cross-sectional view and a plan view schematically illustrating the liquid crystal display device 100, respectively. FIG. 2 illustrates a region corresponding to one pixel of the liquid crystal display device 100, and FIG. 1 illustrates a cross-sectional structure along the line 1A-1A' in FIG. 2.

As illustrated in FIG. 1, the liquid crystal display device 100 includes an active matrix substrate (hereinafter, referred to as a "TFT substrate") 10, a counter substrate 20 facing the TFT substrate 10, and a liquid crystal layer 30 provided between the TFT substrate 10 and the counter substrate 20. In addition, the liquid crystal display device 100 includes a plurality of pixels. The plurality of pixels are arrayed in a matrix shape including a plurality of rows and a plurality of columns.

As illustrated in FIG. 2, the TFT substrate 10 includes a plurality of scanning wiring lines (gate bus lines) GL extending in the row direction and a plurality of signal wiring lines (source bus lines) SL extending in the column direction. In addition, the TFT substrate 10 includes a thin film transistor (TFT) 11, a pixel electrode 12, a common electrode 13, a color filter 14, and a connecting electrode 15 in each of the plurality of pixels. Note that, in FIG. 2, the pixel electrode 12, the common electrode 13, and the like are omitted. The constituent elements of the TFT substrate 10 (the above-described TFT 11 and the like) are supported by a transparent substrate 10a (e.g., a glass substrate) having electrically insulating properties. In the illustrated example, a base coat layer 16 is formed on the substrate 10a, and the TFT 11 and the like are provided on the base coat layer 16.

The TFT 11 includes a semiconductor layer 11a, a gate electrode 11g (11g1, 11g2), a source electrode 11s, and a drain electrode 11d. Here, the TFT 11 having the top gate structure is illustrated.

The semiconductor layer 11a is provided on the base coat layer 16. In the present embodiment, the semiconductor layer 11a is a polycrystalline silicon layer (e.g., a low-temperature polysilicon (LTPS) layer). A gate insulating layer 17 is formed covering the semiconductor layer 11a.

The gate electrodes 11g1 and 11g2 and the scanning wiring lines GL are provided on the gate insulating layer 17. The gate electrodes 11g1 and 11g2 and the scanning wiring lines GL are formed of a metal material. The gate electrodes 11g1 and 11g2 are electrically connected to the corresponding scanning wiring line GL and supplied with a scanning signal (a gate signal) from the scanning wiring line GL. In the illustrated example, the portions of the scanning wiring line GL that overlap the semiconductor layer 11a function as the gate electrodes 11g1 and 11g2. In other words, the scanning wiring line GL and the gate electrodes 11g1 and 11g2 are integrally formed. An interlayer insulating layer 18 is formed covering the gate electrodes 11g1 and 11g2, and the like.

The source electrode 11s, the drain electrode 11d, and the signal wiring lines SL are provided on the interlayer insulating layer 18. The source electrode 11s, the drain electrode 11d, and the signal wiring lines SL are formed of a metal material. Openings (contact holes) CHs and CHd that each expose a portion of the semiconductor layer 11a are formed in the gate insulating layer 17 and the interlayer insulating layer 18, and the source electrode 11s and the drain electrode 11d are connected to the semiconductor layer 11a in the openings CHs and CHd, respectively. The source electrode 11s is electrically connected to the corresponding signal wiring line SL and supplied with a display signal (a source signal) from the signal wiring line SL. In the illustrated example, a portion of the signal wiring line SL serves as the source electrode 11s. In other words, the signal wiring line SL and the source electrode 11s are integrally formed. The drain electrode 11d is electrically connected to the pixel electrode 12.

The pixel electrode 12 is formed of a transparent conductive material (e.g., ITO). The pixel electrode 12 is electrically connected to the TFT 11, more specifically, to the drain electrode 11d of the TFT 11.

The color filter 14 is located between the TFT 11 and the pixel electrode 12. The color filter 14 of each pixel is any of a red color filter, a green color filter, and a blue color filter, for example.

The connecting electrode 15 is formed of a transparent conductive material (e.g., ITO). The connecting electrode 15 connects the TFT 11 and the pixel electrode 12 to each other.

The color filter 14 includes a first color filter layer (a lower color filter layer) 14a provided on the TFT 11 and a second color filter layer (an upper color filter layer) 14b provided on the first color filter layer 14a. That is, the color filter 14 has a layered structure. The first color filter layer 14a and the second color filter layer 14b are color filter layers of substantially the same color. For example, in a case in which the color filter 14 is a red color filter, both the first color filter layer 14a and the second color filter layer 14b are red color filter layers. The first color filter layer 14a and the second color filter layer 14b are formed of a colored photosensitive resin material, for example.

The first color filter layer 14a includes a first contact hole CH1. In the first contact hole CH1, the TFT 11 is connected to the connecting electrode 15. The first contact hole CH1 is formed to expose a portion of the drain electrode 11d of the TFT 11. The connecting electrode 15 is provided between the first color filter layer 14a and the second color filter layer 14b, and the drain electrode 11d of the TFT 11 and the connecting electrode 15 are connected in the first contact hole CH1.

The second color filter layer 14b includes a second contact hole CH2. In the second contact hole CH2, the connecting electrode 15 is connected to the pixel electrode 12. The second contact hole CH2 is formed to expose a portion of the connecting electrode 15. The pixel electrode 12 is provided on the second color filter layer 14b, and the connecting electrode 15 is connected to the pixel electrode 12 in the second contact hole CH2. Here, when a region surrounded by two scanning wiring lines GL adjacent to each other and two signal wiring lines SL adjacent to each other is referred to as a "pixel opening region," the second contact hole CH2 is located in the pixel opening region in the illustrated example.

A dielectric layer 19 is formed covering the pixel electrode 12, and the common electrode 13 is formed on the dielectric layer 19. The common electrode 13 is formed of a transparent conductive material (e.g., ITO). Although not illustrated here, at least one slit is formed in the common electrode 13.

When viewed in the normal direction of the display surface, the first contact hole CH1 and the second contact hole CH2 do not overlap each other. In other words, the first contact hole CH1 and the second contact hole CH2 are disposed shifted from each other.

Although not illustrated here, alignment films are provided on the outermost surface of the TFT substrate 10 closer to the liquid crystal layer 30 and the outermost surface of the counter substrate 20 closer to the liquid crystal layer 30. In the present embodiment, the alignment film of the TFT substrate 10 and the alignment film of the counter substrate 20 are each horizontal alignment film.

Figure 16:
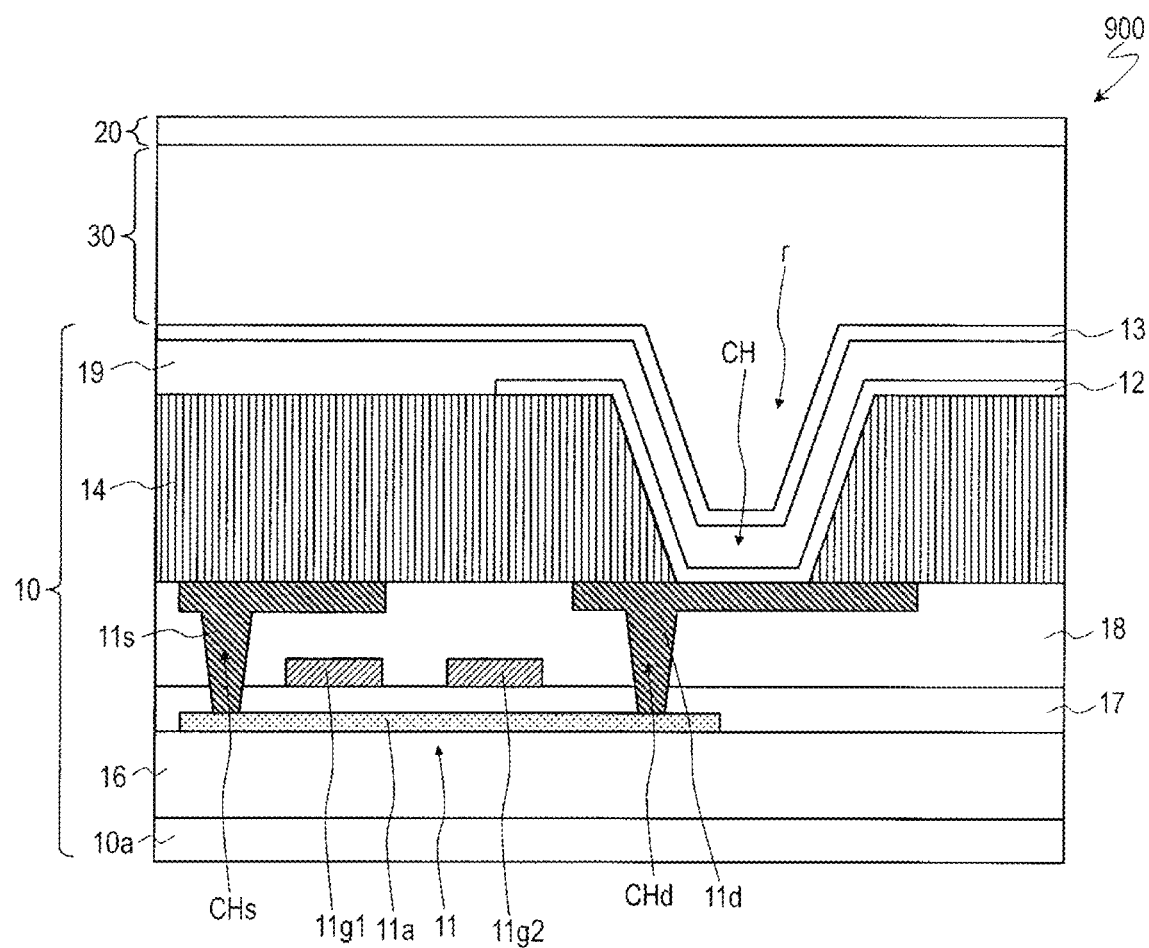
FIG. 16 is a cross-sectional view schematically illustrating a liquid crystal display device 900 of a comparative example, illustrating a cross-sectional structure along a line 16A-16A' in FIG. 17.
Figure 17:
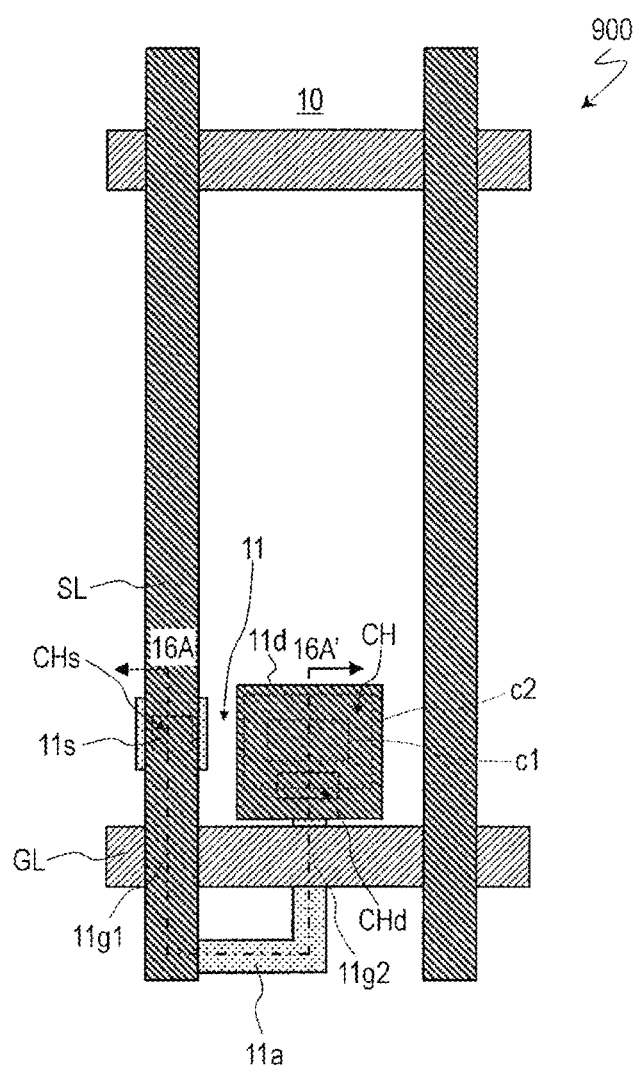
FIG. 17 is a plan view schematically illustrating the liquid crystal display device 900, illustrating a region corresponding to one pixel.

In the liquid crystal display device 100 having the configuration described above, an aperture ratio can be increased in comparison to a conventional liquid crystal display device having a COA structure. Hereinafter, although the reasons will be described, before the reasons are provided, reasons for deterioration in the aperture ratio due to the application of the COA structure will be described below with reference to FIGS. 16 and 17. FIG. 17 is a plan view schematically illustrating a region corresponding to one pixel of a liquid crystal display device 900 of a comparative example, and FIG. 16 is a cross-sectional view taken along a line 16A-16A' in FIG. 17.

The liquid crystal display device 900 of the comparative example differs from the liquid crystal display device 100 illustrated in FIG. 1 or the like in that the color filter 14 does not have a layered structure (i.e., it has a single-layer structure). The color filter 14 of the liquid crystal display device 900 includes a contact hole CH formed to expose a portion of the drain electrode 11d. The pixel electrode 12 is connected to the drain electrode 11d in the contact hole CH. FIG. 17 illustrates both a profile c1 of a lower end and a profile c2 of an upper end of the contact hole CH.

In the liquid crystal display device 900 of the comparative example, the region of the color filter 14 in which the contact hole CH is formed is a region that does not contribute to color display (hereinafter also referred to as an "uncolored region") since there is no colored layer of the color filter 14. In addition, a surface of the TFT substrate 10 closer to the liquid crystal layer 30 has a recess r conforming to the shape of the contact hole CH, and alignment of the liquid crystal molecules may be disturbed by a large step formed due to the presence of the recess r. For this reason, to prevent deterioration in display quality caused by the disturbance in the alignment, it is necessary to shield the contact hole CH and the vicinity thereof from light. In the illustrated example, the drain electrode 11d of the TFT 11 overlaps a region including an upper end of the contact hole CH (defined by the profile c2) and the region is shielded by the drain electrode 11d from light.

In this way, in the liquid crystal display device 900 of the comparative example, since the contact hole CH of the color filter 14 and the vicinity thereof need to be shielded from light by a relatively large light-shielding layer formed of a metal material or the like, an aperture ratio becomes lower. In addition, a low aperture ratio is disadvantageous to high definition.

In contrast, in the liquid crystal display device 100 according to the embodiment of the present invention, the color filter 14 of the TFT substrate 10 includes the first color filter layer 14a and the second color filter layer 14b, and when viewed in the normal direction of the display surface, the contact hole (a first contact hole) CH1 of the first color filter layer 14a and the contact hole (a second contact hole) CH2 of the second color filter layer 14b do not overlap each other. Accordingly, a colored layer of the second color filter layer 14b is present within and above the first contact hole CH1, and a colored layer of the lower color filter layer 14a is present below the second contact hole CH2. Accordingly, an uncolored region can be reduced. In addition, since a step in the surface of the TFT substrate 10 can be reduced further in comparison to a case in which the contact hole CH is formed in a single-layer color filter 14 (see FIG. 11), the disturbance in alignment is less likely to occur and a region to be shielded from light can be reduced. In the example illustrated in FIGS. 1 and 2, the region in which the second contact hole CH2 is formed is not shielded from light by the drain electrode 11d.

In this way, in the liquid crystal display device 100 of the present embodiment, since a region that does not contribute to the aperture ratio (ineffective region) caused by adopting the COA structure can be reduced, the aperture ratio is improved.

Note that, although a thickness t1 of the first color filter layer 14a and a thickness t2 of the second color filter layer 14b are not particularly limited to a specific thickness, in a configuration in which the second contact hole CH2 is located in the pixel opening region, the thickness t2 of the second color filter layer 14b is preferably less than the thickness t1 of the first color filter layer 14a as illustrated in FIG. 1 and the like. In the region in which the second contact hole CH2 is formed, only the colored layer of the first color filter layer 14a is present as the colored layer of the color filter 14, and thus light transmitted through this region may have lower color purity (chroma) than that of light transmitted through other regions. By making the thickness t2 of the second color filter layer 14b relatively small, i.e., making the thickness t1 of the first color filter layer 14a relatively large, a reduction in color purity in the region in which the second contact hole CH2 is formed can be avoided. Additionally, the effect of reducing the step caused by the second contact hole CH2 can be obtained.

Second Embodiment

Figure 3:
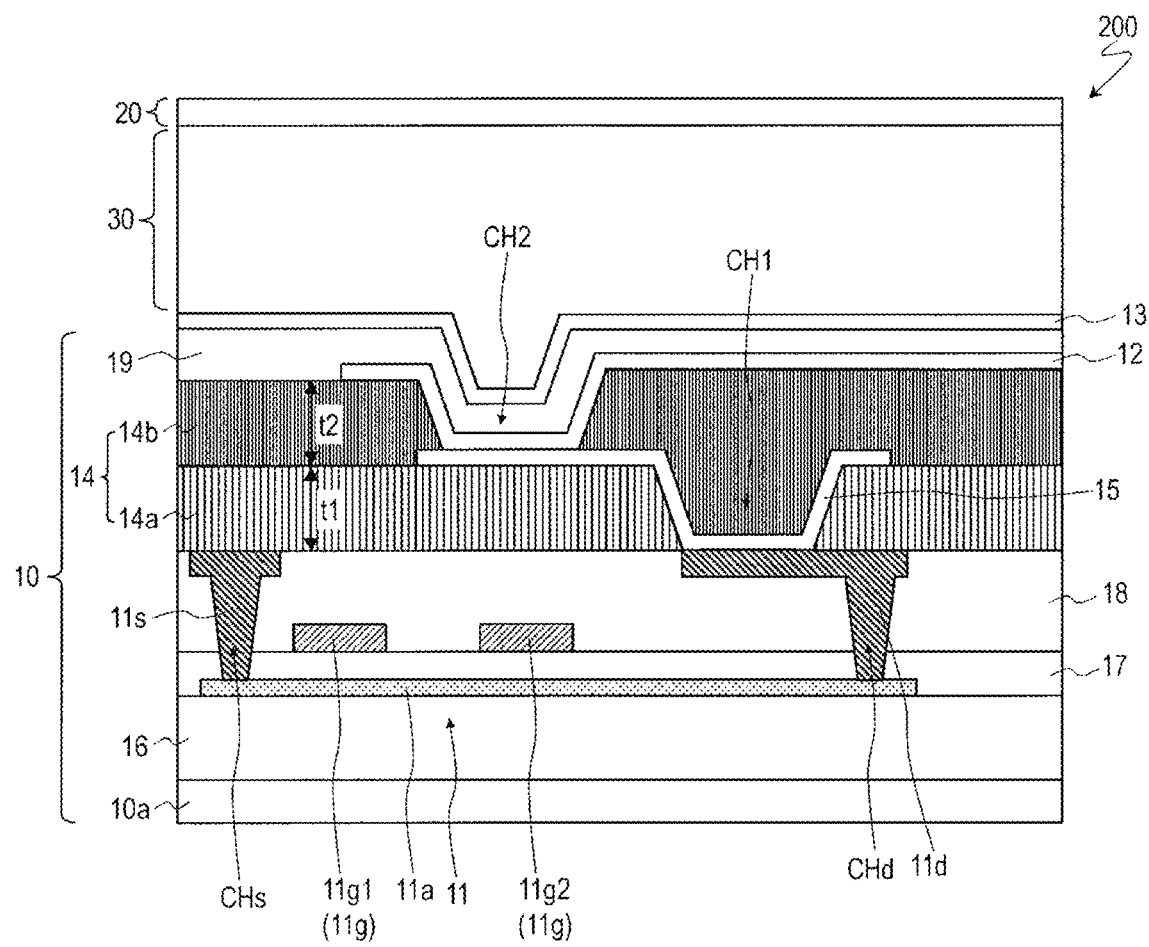
FIG. 3 is a cross-sectional view schematically illustrating a liquid crystal display device 200 according to an embodiment of the present invention, illustrating a cross-sectional structure along a line 3A-3A' in FIG. 4.
Figure 4:
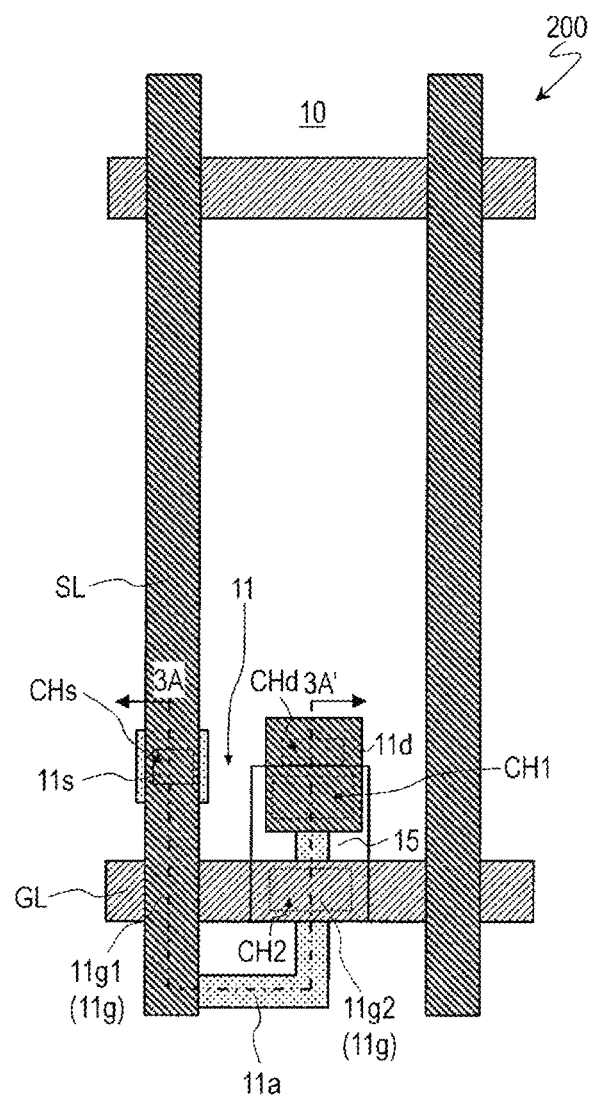
FIG. 4 is a plan view schematically illustrating the liquid crystal display device 200, illustrating a region corresponding to one pixel.

A liquid crystal display device 200 according to the present embodiment will be described with reference to FIGS. 3 and 4. FIGS. 3 and 4 are a cross-sectional view and a plan view schematically illustrating the liquid crystal display device 200, respectively. FIG. 4 illustrates a region corresponding to one pixel of the liquid crystal display device 200, and FIG. 3 illustrates a cross-sectional structure along a line 3A-3A' in FIG. 4. In the following, a description will be given focusing on differences of the liquid crystal display device 200 from the liquid crystal display device 100 of the first embodiment.

As illustrated in FIGS. 3 and 4, in the liquid crystal display device 200 of the present embodiment, the color filter 14 of the TFT substrate 10 includes the first color filter layer 14a and the second color filter layer 14b, and when viewed in a normal direction of a display surface, the first contact hole CH1 and the second contact hole CH2 do not overlap each other, similarly to the liquid crystal display device 100 of the first embodiment. In this way, an ineffective region generated by adopting the COA structure can be reduced in the liquid crystal display device 200 of the present embodiment as well, and thus an aperture ratio is improved.

In addition, in the liquid crystal display device 100 of the first embodiment, the second contact hole CH2 is located within the pixel opening region. In contrast, in the liquid crystal display device 200 of the present embodiment, the second contact hole CH2 at least partially overlaps the scanning wiring line GL when viewed in the normal direction of the display surface.

In a region in which the second contact hole CH2 is formed, only the colored layer of the first color filter layer 14a is present as a colored layer of the color filter 14. Therefore, light transmitted through this region has lower color purity (chroma) than that of light transmitted through other regions. For this reason, the second contact hole CH2 is disposed at least partially overlapping the scanning wiring line GL as described in the present embodiment, and this can further increase the color purity. In addition, this disposition allows a step caused by the second contact hole CH2 to be positioned on the scanning wiring line GL. Since the region on the scanning wiring line GL is shielded from light coming from the backlight, deterioration in display quality caused by the step of the second contact hole CH2 can be avoided, and display quality can be further improved.

Third Embodiment

Figure 5A:
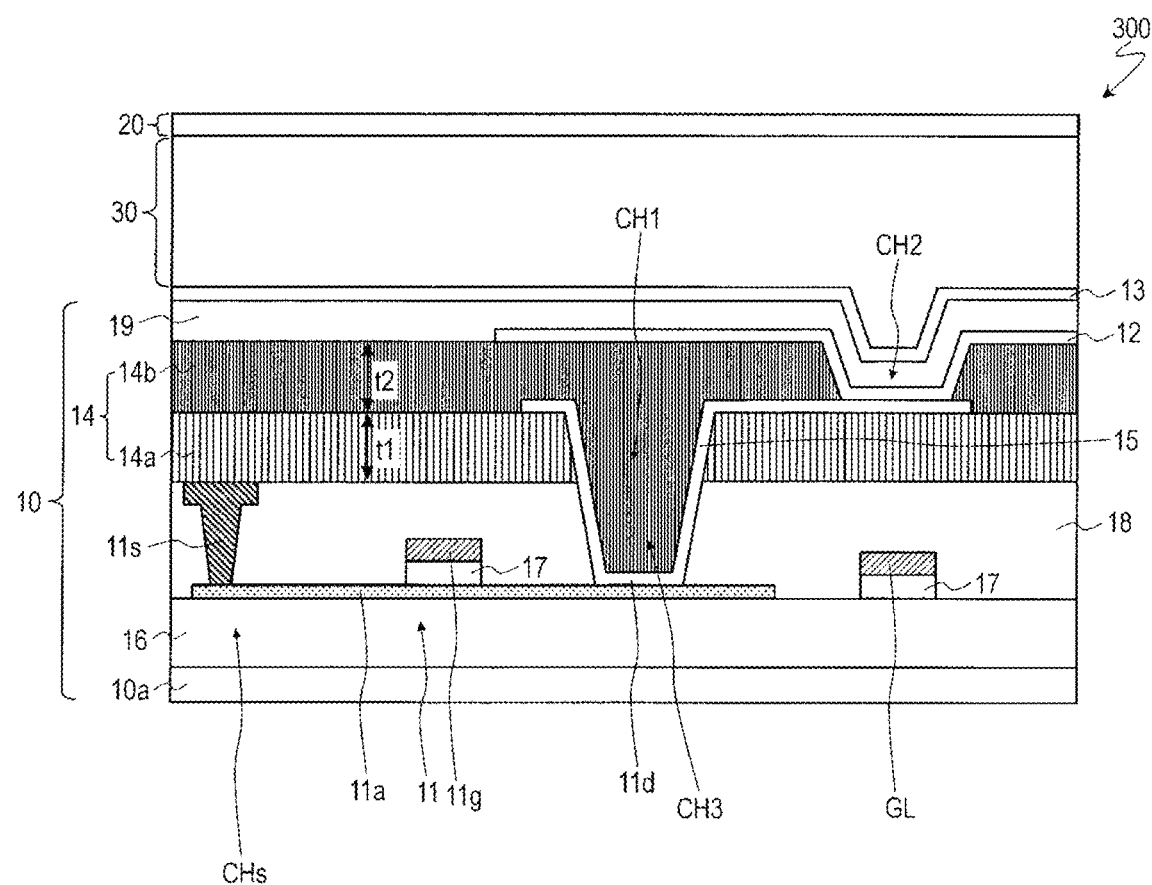
FIG. 5A is a cross-sectional view schematically illustrating a liquid crystal display device 300 according to an embodiment of the present invention, illustrating a cross-sectional structure along a line 5A-5A' in FIG. 5B.
Figure 5B:
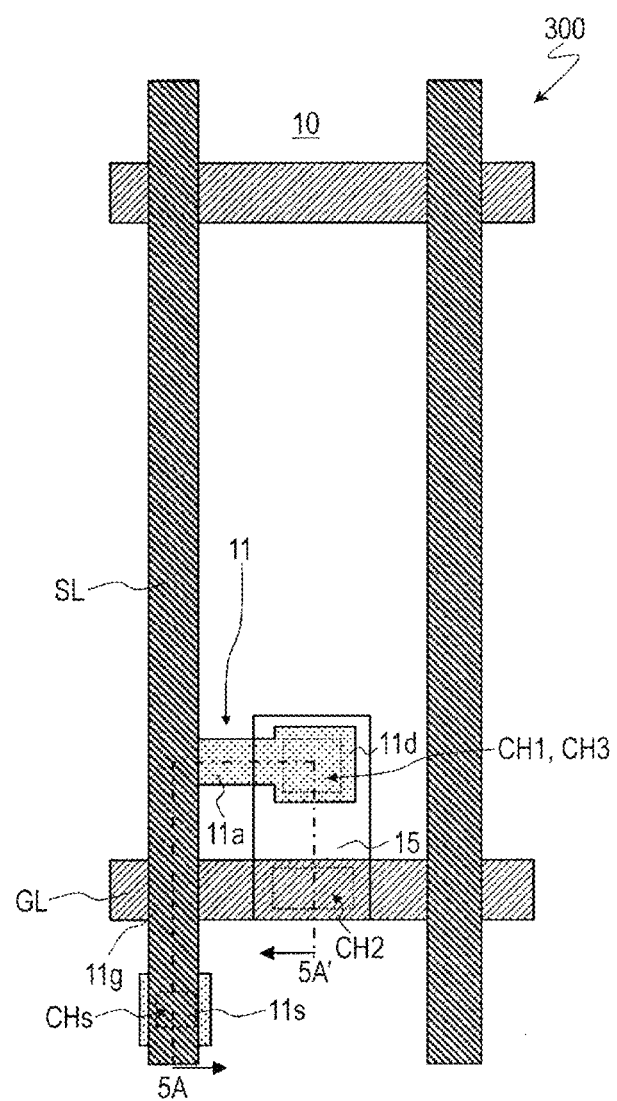
FIG. 5B is a plan view schematically illustrating the liquid crystal display device 300, illustrating a region corresponding to one pixel.

A liquid crystal display device 300 according to the present embodiment will be described with reference to FIGS. 5A and 5B. FIGS. 5A and 5B are a cross-sectional view and a plan view schematically illustrating the liquid crystal display device 300, respectively. FIG. 5B illustrates a region corresponding to one pixel of the liquid crystal display device 300, and FIG. 5A illustrates a cross-sectional structure along a line 5A-5A' in FIG. 5B. In the following, a description will be given focusing on differences of the liquid crystal display device 300 from the liquid crystal display device 100 according to the first embodiment.

In the liquid crystal display device 300 of the present embodiment, the TFT 11 is an oxide semiconductor TFT having a top gate structure. In other words, the semiconductor layer 11a of the TFT 11 is an oxide semiconductor layer.

In addition, in the present embodiment, the drain electrode 11d of the TFT 11 is integrally formed with the connecting electrode 15 as illustrated in FIGS. 5A and 5B. That is, the drain electrode 11d is a transparent drain electrode formed of a transparent conductive material, and the TFT 11 includes no drain electrode formed of a metal material. Note that, in the following, the connecting electrode 15 and the drain electrode 11d integrally formed with the connecting electrode 15 may be referred to collectively as a "transparent electrode layer."

The interlayer insulating layer 18 covering the oxide semiconductor layer 11a and the gate electrode 11g includes a third contact hole CH3 that is continuous with the first contact hole CH1. In the third contact hole CH3, the transparent drain electrode 11d is connected to the oxide semiconductor layer 11a.

In the present embodiment, the drain electrode 11d of the TFT 11 is a transparent drain electrode. In addition, the oxide semiconductor layer 11a can be generally transparent. Thus, a region in which the first contact hole CH1 is formed can be made contribute to an aperture ratio. Therefore, in the liquid crystal display device 300 of the present embodiment, an aperture ratio can be further improved in comparison to the liquid crystal display devices 100 and 200 of the first and the second embodiments.

Note that, in the liquid crystal display device 300, the second contact hole CH2 overlaps the scanning wiring line GL, and the first contact hole CH1 is located within the pixel opening region. In such a configuration, preferably, the thickness t2 of the second color filter layer 14b is greater than the thickness t1 of the first color filter layer 14a. Since there is only a colored layer of the second color filter layer 14b as a colored layer of the color filter 14 in the region in which the first contact hole CH1 is formed, light transmitted through this region may have lower color purity (chroma) than light transmitted through other regions. In a case where the thickness t2 of the second color filter layer 14b is made relatively large, a reduction in color purity in the region in which the first contact hole CH1 is formed can be avoided.

Figure 6A:
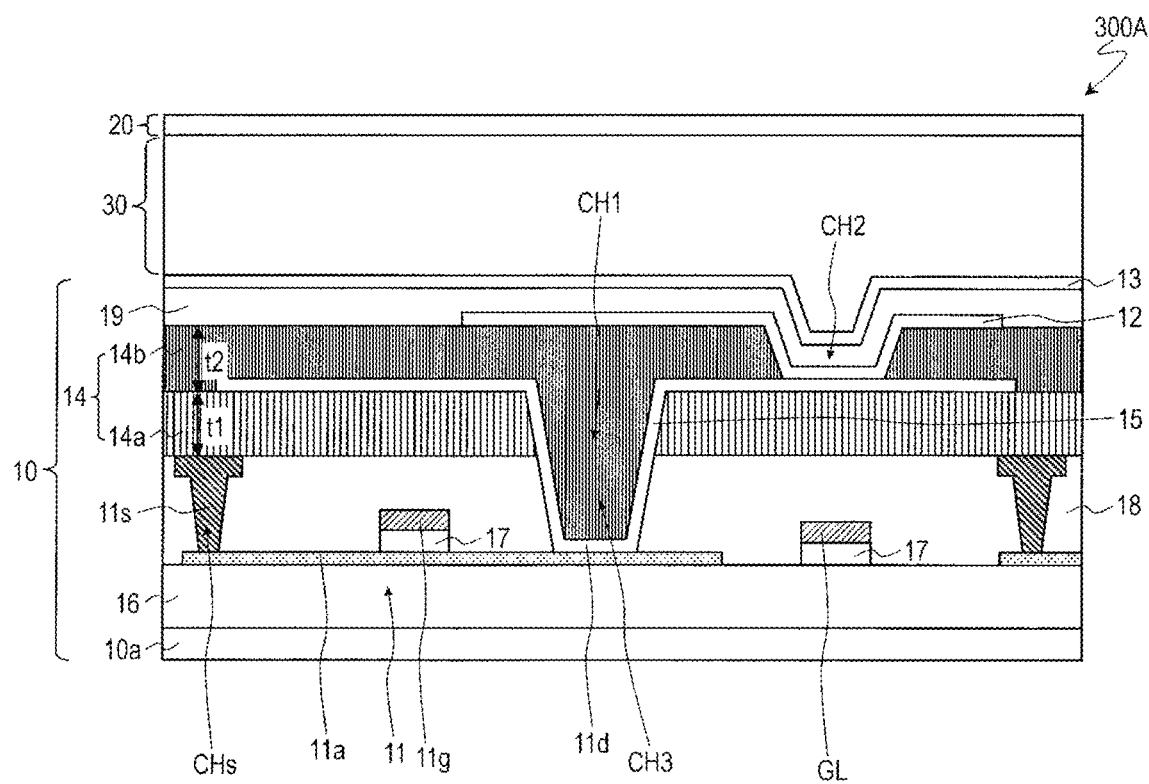
FIG. 6A is a cross-sectional view schematically illustrating a liquid crystal display device 300A according to an embodiment of the present invention, illustrating a cross-sectional structure along a line 6A-6A' in FIG. 6B.
Figure 6B:
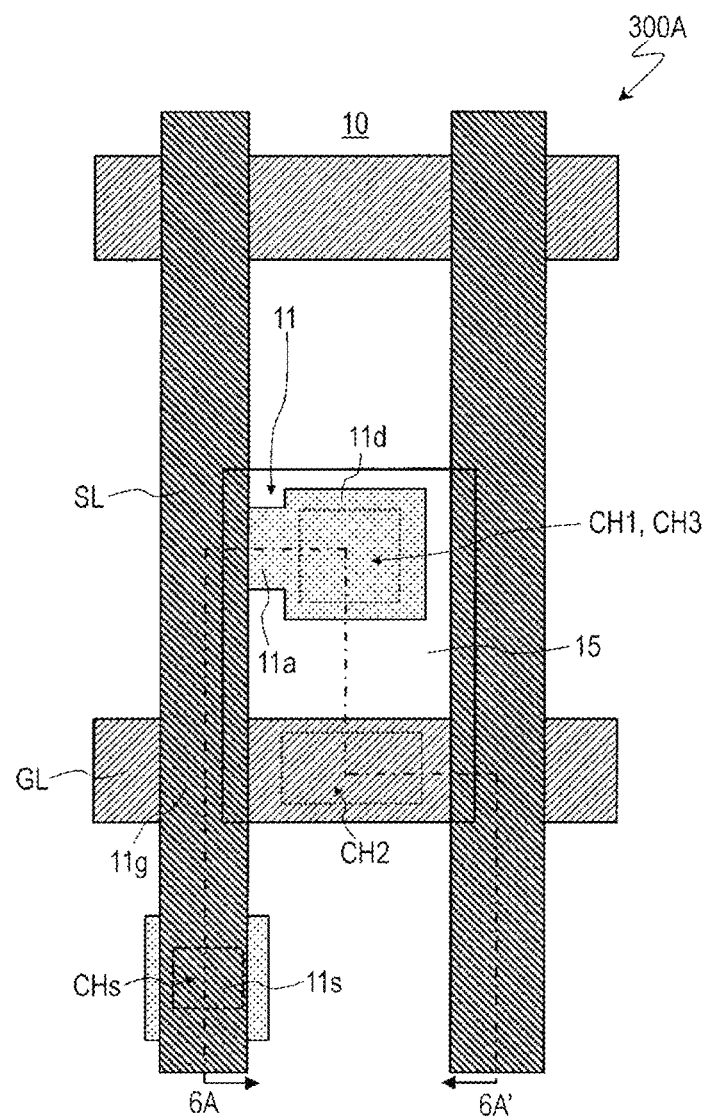
FIG. 6B is a plan view schematically illustrating the liquid crystal display device 300A, illustrating a region corresponding to one pixel.

In addition, in the liquid crystal display device 300 of the present embodiment, the drain electrode 11d of the TFT 11 is formed in a separate layer from the signal wiring lines SL. For this reason, a configuration in which a transparent electrode layer including the drain electrode (transparent drain electrode) 11d and the connecting electrode 15 at least partially overlaps the signal wiring line SL when viewed in the normal direction of the display surface can also be adopted. Employing such a configuration can provide a display device with greater definition. FIGS. 6A and 6B illustrate a liquid crystal display device 300A employing such a configuration. FIG. 6B illustrates a region corresponding to one pixel of the liquid crystal display device 300A, and FIG. 6A illustrates a cross-sectional structure along line 6A-6A' in FIG. 6B.

In the liquid crystal display device 300A, as illustrated in FIGS. 6A and 6B, the transparent electrode layer including the transparent drain electrode 11d and the connecting electrode 15 partially overlaps the signal wiring lines SL. Therefore, greater definition can be achieved.

Note that, although the second contact hole CH2 at least partially overlaps the scanning wiring line GL when viewed in the normal direction of the display surface in the examples illustrated in FIGS. 5A, 5B, 6A, and 6B, the second contact hole CH2 may be located within the pixel opening region. However, for the same reason as described for the liquid crystal display device 200 of the second embodiment, preferably, the second contact hole CH2 at least partially overlaps the scanning wiring line GL as illustrated in FIG. 5A and the like from the viewpoint of further improvement in color purity and avoidance of deterioration in display quality caused by the step of the second contact hole CH2.

Fourth Embodiment

Figure 7:
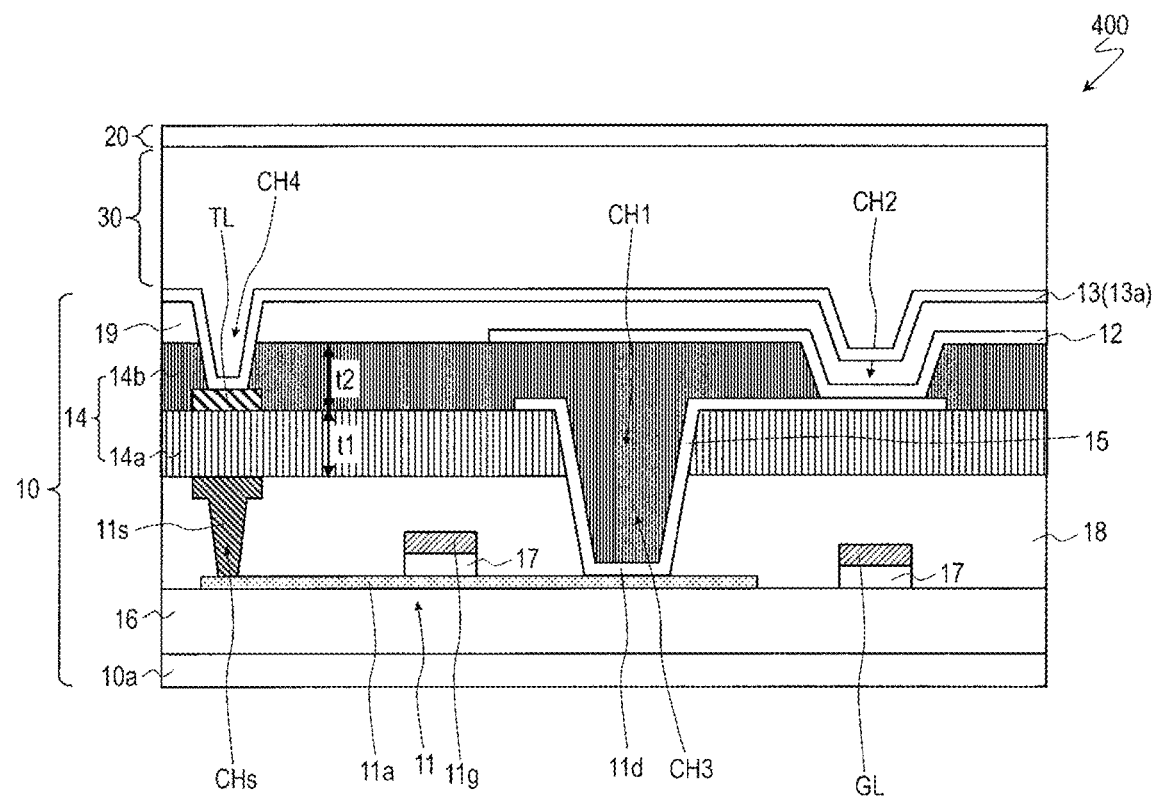
FIG. 7 is a cross-sectional view schematically illustrating a liquid crystal display device 400 according to an embodiment of the present invention, illustrating a cross-sectional structure along a line 7A-7A' in FIG. 8.
Figure 8:
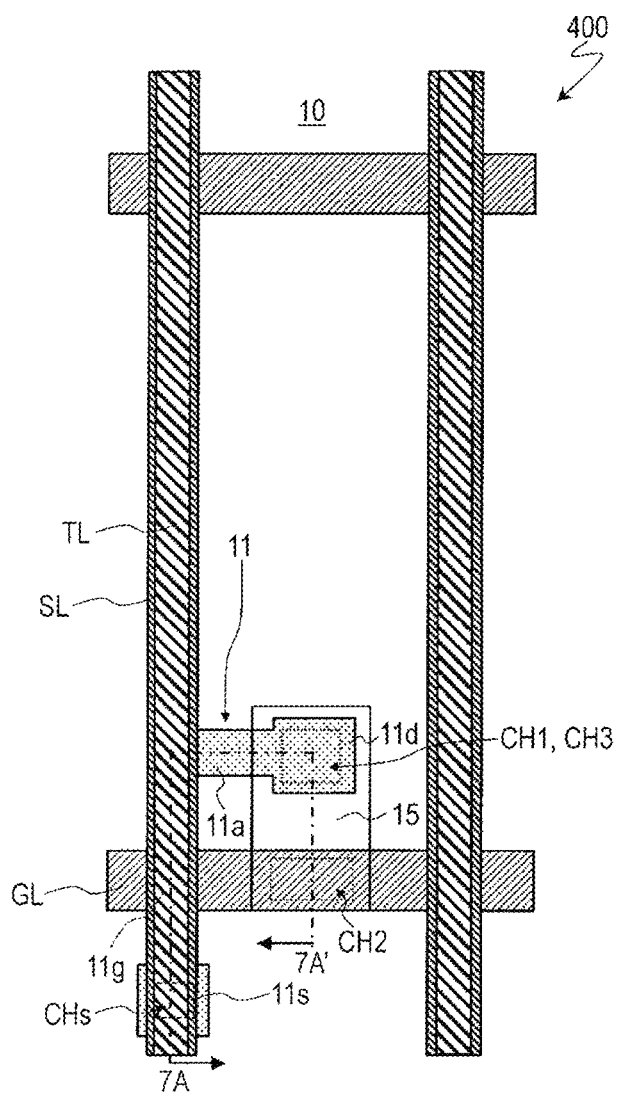
FIG. 8 is a plan view schematically illustrating the liquid crystal display device 400, illustrating a region corresponding to one pixel.

A liquid crystal display device 400 according to the present embodiment will be described with reference to FIGS. 7 and 8. FIGS. 7 and 8 are a cross-sectional view and a plan view schematically illustrating the liquid crystal display device 400, respectively. FIG. 8 illustrates a region corresponding to one pixel of the liquid crystal display device 400, and FIG. 7 illustrates a cross-sectional structure along a line 7A-7A' in FIG. 8. In the following, a description will be given focusing on differences of the liquid crystal display device 400 from the liquid crystal display device 300 according to the third embodiment.

The liquid crystal display device 400 may function as an in-cell touch panel. As illustrated in FIGS. 7 and 8, the TFT substrate 10 of the liquid crystal display device 400 includes a plurality of sensor wiring lines TL for a touch panel. The sensor wiring lines TL are formed of a metal material. Each sensor wiring line TL is provided between the first color filter layer 14a and the second color filter layer 14b. Each sensor wiring line TL extends in a column direction and overlaps the signal wiring line SL when viewed in the normal direction of a display surface.

In the present embodiment, the common electrode 13 is divided into a plurality of sub-electrodes 13a. Each sensor wiring line TL is electrically connected to any of the plurality of sub-electrodes 13a. In the example illustrated in FIG. 7, the sensor wiring line TL is connected to one of the sub-electrodes 13a in a fourth contact hole CH4 formed in the dielectric layer 19 and the second color filter layer 14b. An example of a configuration in which the liquid crystal display device 400 can function as an in-cell touch panel will be described with reference to FIG. 9.

Figure 9:
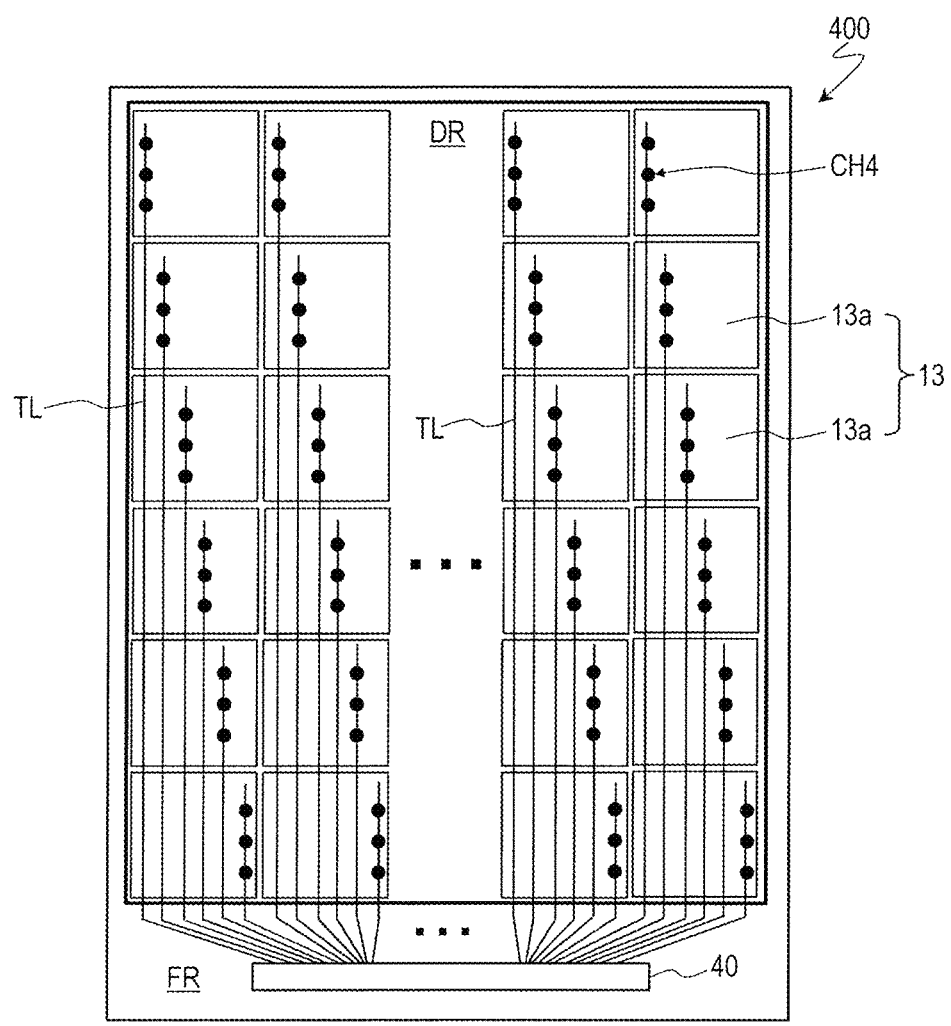
FIG. 9 is a diagram illustrating an example of a configuration in which the liquid crystal display device 400 can function as an in-cell touch panel.

As illustrated in FIG. 9, the liquid crystal display device 400 includes a display region DR defined by a plurality of pixels and a peripheral region (also referred to as a "frame region") FR located around the display region DR. The plurality of sub-electrodes 13a of the common electrode 13 are disposed in a matrix shape within the display region DR. A source driver IC 40 that functions as a source driver configured to drive the signal wiring lines SL is disposed in the peripheral region FR. Note that a gate driver is not illustrated here.

The source driver IC 40 includes a sensor drive and reading circuit, and the plurality of sensor wiring lines TL are connected to the source driver IC 40. Each of the sub-electrodes 13a is connected to the corresponding sensor wiring line TL in the contact hole (the fourth contact hole) CH4.

Figure 10:
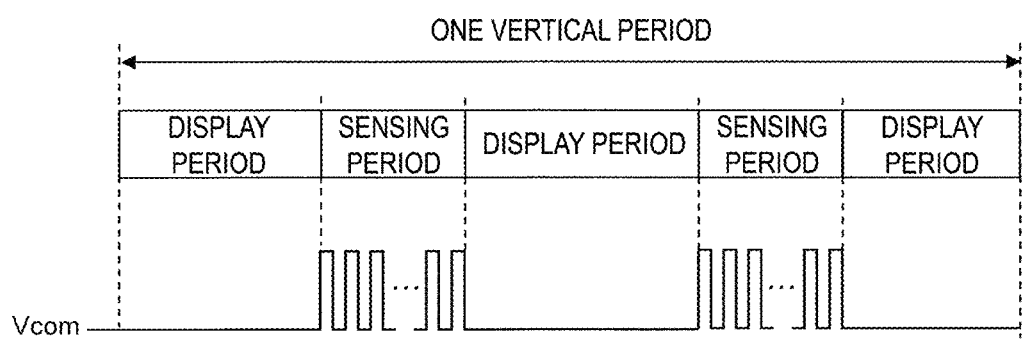
FIG. 10 is a timing chart illustrating timings of change in a common voltage in one vertical period.

A method of driving the liquid crystal display device 400 also functioning as a touch panel will be described with reference to FIG. 10. FIG. 10 is a timing chart illustrating timings of change in a common voltage in one vertical period.

As illustrated in FIG. 10, one vertical period is divided into a period in which a display signal is written in each pixel while performing a line-sequential scanning (display period) and a period in which sensing is performed (sensing period). In each display period, a Vcom signal of a direct current is supplied to the plurality of sub-electrodes 13a of the common electrode 13 as a common voltage. The Vcom signal is supplied from the source driver IC. In each sensing period, a Vcom signal of an alternating current having a constant amplitude is supplied to the plurality of sub-electrodes 13a of the common electrode 13. Accordingly, a capacitance between each of the sub-electrodes 13a and a target object (e.g., a finger) can be measured and read, and the liquid crystal display device 400 can function as a touch panel.

According to the present embodiment, an in-cell touch panel with a great aperture ratio can be realized.

Note that, although liquid crystal display devices in an FFS mode have been exemplified in the first to the fourth embodiments described above, a display mode is not limited to the FFS mode. Other display modes (e.g., a VA mode) may be used.

In a case in which a display mode is the FFS mode, a configuration in which the common electrode 13 is located above the pixel electrode 12 as exemplified in the first to the fourth embodiments may be employed, or a configuration in which the pixel electrode 12 is located above the common electrode 13 (i.e., a configuration in which the common electrode 13 is provided between the second color filter layer 14b and the dielectric layer 19, and the pixel electrode 12 is provided on the dielectric layer 19) may be employed. In this case, for example, an opening continuous with the second contact hole CH2 is formed in the dielectric layer 19, and the pixel electrode 12 is directly connected to the connecting electrode 15 in the second contact hole CH2. In addition, the pixel electrode 12 may be connected to the connecting electrode 15 with another connecting electrode formed of the same conductive film as that of the common electrode 13 interposed therebetween.

An insulating layer may be provided between the first color filter layer 14a and the second color filter layer 14b and/or between a source metal layer (a layer including the source electrode 11s, the drain electrode 11d, and the signal wiring lines SL) and the first color filter layer 14a. In a case where such an insulating layer is provided, contamination attributable to the color filter 14 can be prevented.

Although the TFT 11 of the top gate structure including a polycrystalline silicon layer or an oxide semiconductor layer is exemplified as the semiconductor layer 11a in the foregoing description, the TFT 11 is not limited thereto. For example, a TFT 11 of a bottom gate structure including an oxide semiconductor layer or an amorphous silicon layer as the semiconductor layer 11a may be used.

In addition, the color filter 14 may also include three or more color filter layers. In a case where the color filter 14 includes three or more color filter layers, the step caused by the contact holes can be further reduced, and deterioration in display quality can be further avoided. In the case where the color filter 14 includes three or more color filter layers, the TFT substrate 10 includes a plurality of connecting electrodes in each pixel. For example, in a case where the color filter 14 includes three color filter layers, the TFT substrate 10 can include two connecting electrodes in each pixel.

Figure 11:
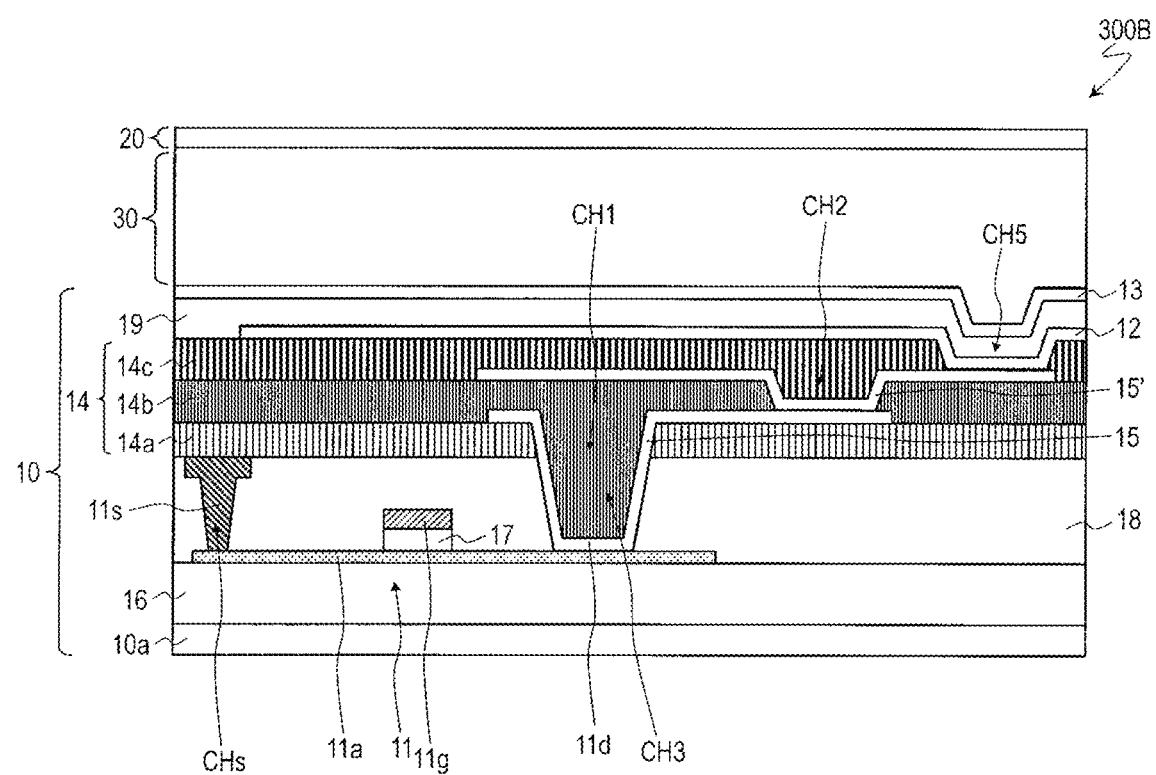
FIG. 11 is a cross-sectional view schematically illustrating a liquid crystal display device 300B according to an embodiment of the present invention, illustrating a cross-sectional structure along a line 11A-11A' in FIG. 12.
Figure 12:
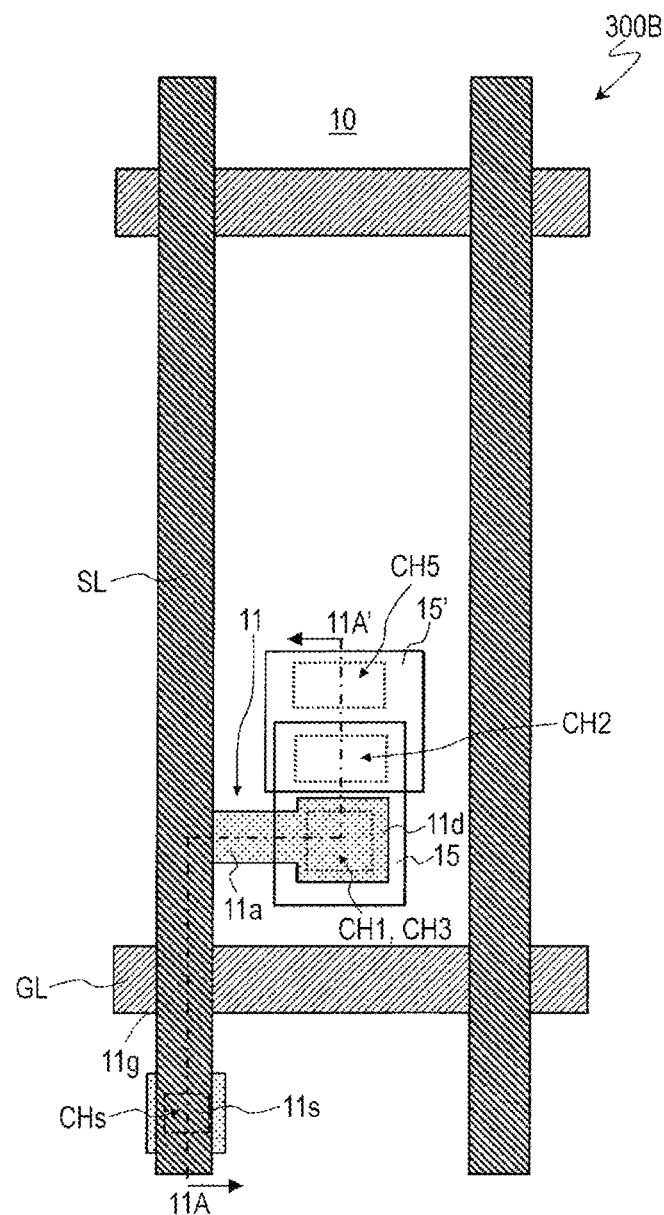
FIG. 12 is a plan view schematically illustrating the liquid crystal display device 300B, illustrating a region corresponding to one pixel.

FIGS. 11 and 12 illustrate a liquid crystal display device 300B provided with the color filter 14 including three color filter layers 14a, 14b, and 14c. FIG. 12 is a plan view illustrating a region corresponding to one pixel of the liquid crystal display device 300B, and FIG. 11 is a diagram illustrating a cross-sectional structure along a line 11A-11A' in FIG. 12.

The color filter 14 of the liquid crystal display device 300B differs from the color filter 14 of the liquid crystal display device 300 in that the former includes a third color filter layer 14c in addition to the first color filter layer 14a and the second color filter layer 14b as illustrated in FIG. 11.

In addition, the TFT substrate 10 of the liquid crystal display device 300B differs from the TFT substrate 10 of the liquid crystal display device 300 in that the former includes another connecting electrode 15' connecting the connecting electrode 15 and the pixel electrode 12 as illustrated in FIGS. 11 and 12. Hereinafter, the connecting electrode 15 will be referred to as a "first connecting electrode," and the other connecting electrode 15' will be referred to as a "second connecting electrode."

The third color filter layer 14c is provided on the second color filter layer 14b. The third color filter layer 14c is a color filter layer in substantially the same color as those of the first color filter layer 14a and the second color filter layer 14b and is formed of, for example, a colored photosensitive resin material.

The third color filter layer 14c includes a fifth contact hole CH5. In the fifth contact hole CH5, the second connecting electrode 15' is connected to the pixel electrode 12. The fifth contact hole CH5 is formed to expose a portion of the second connecting electrode 15'. The second connecting electrode 15' is provided between the second color filter layer 14b and the third color filter layer 14c, and the first connecting electrode 15 is connected to the second connecting electrode 15' in the second contact hole CH2. The second connecting electrode 15' is formed of a transparent conductive material (e.g. ITO).

When viewed in the normal direction of a display surface, the fifth contact hole CH5 does not overlap the first contact hole CH1 and the second contact hole CH2. In other words, the fifth contact hole CH5 is disposed shifted from the first contact hole CH1 and the second contact hole CH2.

As described above, since the color filter 14 includes the three color filter layers 14a, 14b, and 14c in the liquid crystal display device 300B, a step caused by the contact holes can be further reduced, and deterioration in display quality can be further avoided.

Fifth Embodiment

Figure 13:
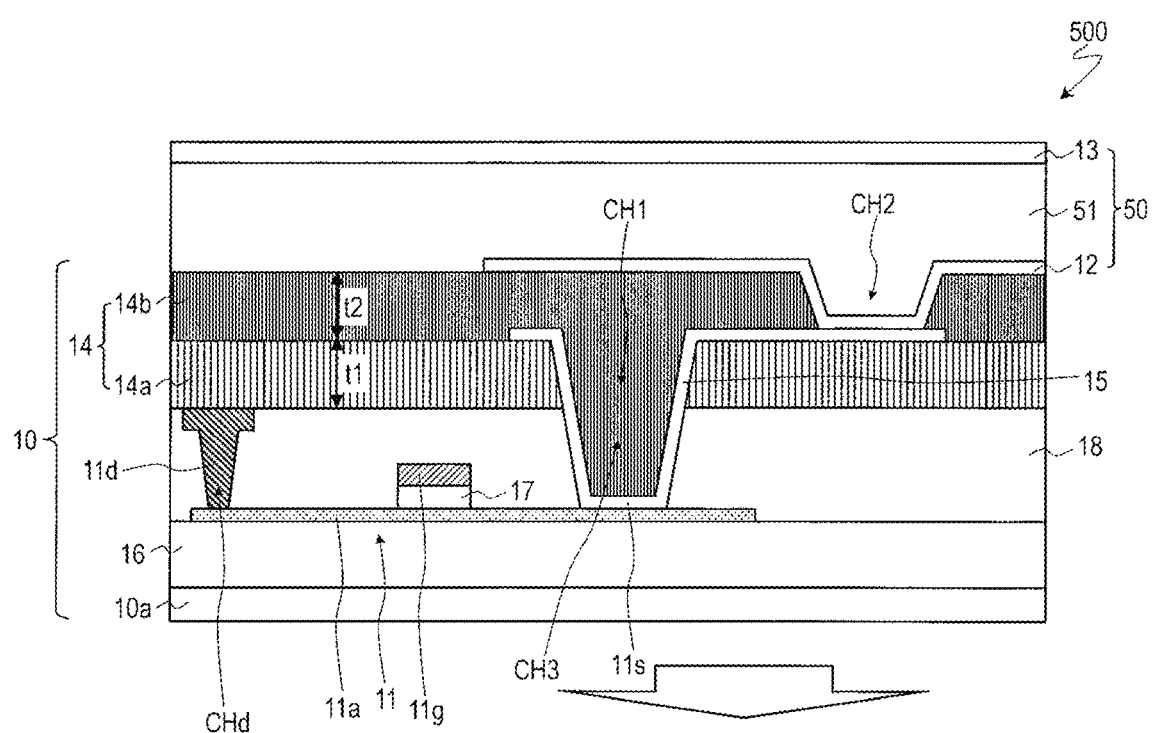
FIG. 13 is a cross-sectional view schematically illustrating an organic EL display device 500 according to an embodiment of the present invention, illustrating a cross-sectional structure along a line 13A-13A' in FIG. 14.
Figure 14:
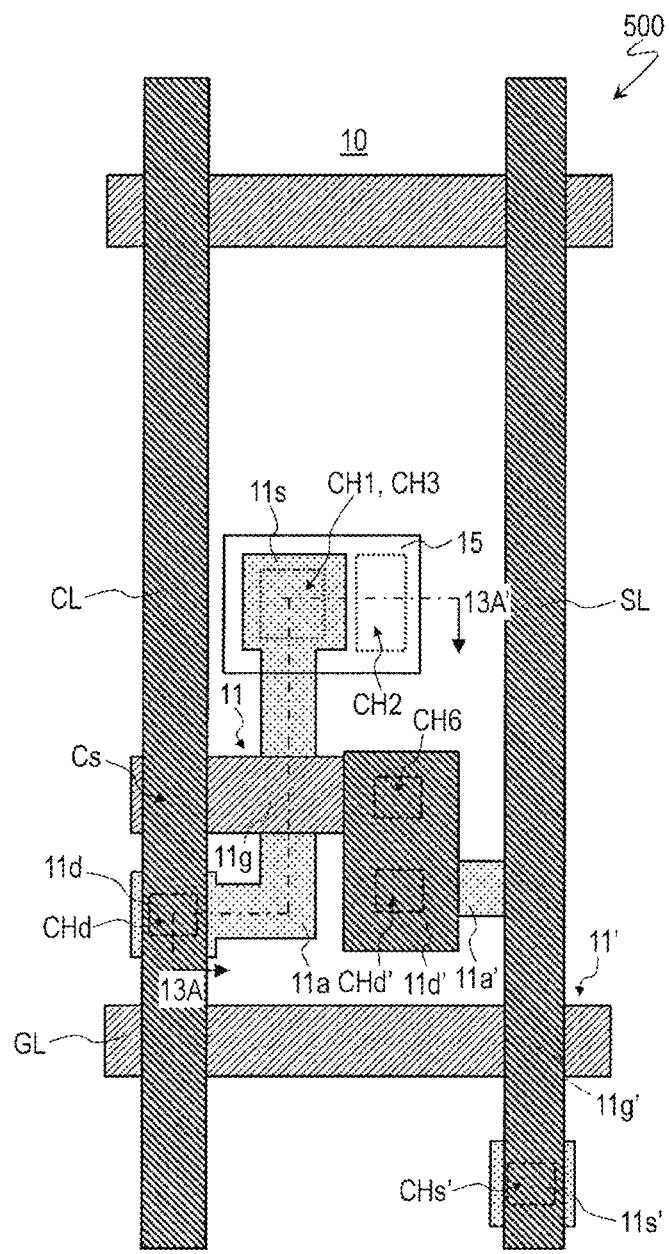
FIG. 14 is a plan view schematically illustrating the organic EL display device 500, illustrating a region corresponding to one pixel.
Figure 15:
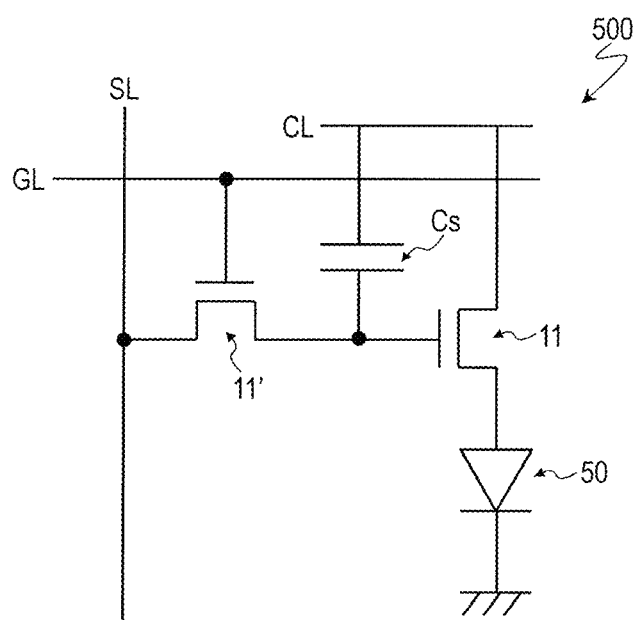
FIG. 15 is an equivalent circuit diagram of one pixel of the organic EL display device 500.

An organic EL display device 500 according to the present embodiment will described with reference to FIGS. 13, 14, and 15. FIGS. 13 and 14 are a cross-sectional view and a plan view schematically illustrating the organic EL display device 500, respectively. FIG. 14 illustrates a region corresponding to one pixel of the organic EL display device 500, and FIG. 13 illustrates a cross-sectional structure along a line 13A-13A' in FIG. 14. FIG. 15 is an equivalent circuit diagram of one pixel of the organic EL display device 500.

The organic EL display device 500 includes the TFT substrate 10 as illustrated in FIG. 13. In addition, the organic EL display device 500 includes a plurality of pixels. The plurality of pixels are arrayed in a matrix shape including a plurality of rows and a plurality of columns. The organic EL display device 500 is a bottom-emitting type device configured to emit light in a back face direction of the TFT substrate 10.

The TFT substrate 10 includes the plurality of scanning wiring lines GL extending in the row direction, the plurality of signal wiring lines SL extending in the column direction, and a plurality of power source wiring lines CL extending in the column direction as illustrated in FIG. 14. In addition, the TFT substrate 10 includes a drive TFT 11, a selection TFT 11', a capacitance element (holding capacitance) Cs, a pixel electrode (anode) 12, a common electrode (cathode) 13, and an organic EL layer 51 in each of the plurality of pixels as illustrated in FIGS. 14 and 15. The anode 12, the organic EL layer 51 provided on the anode 12, and the cathode 13 provided on the organic EL layer 51 constitute an organic light-emitting diode (OLED) 50. The organic EL layer 51 has a layered structure with a plurality of layers formed of an organic semiconductor material. The layered structure includes, for example, a hole injection layer, a hole transport layer, a light-emitting layer, an electron transport layer, and an electron injection layer in this order from the anode 12 side. The constituent elements of the TFT substrate 10 are supported by the transparent substrate 10a (e.g., a glass substrate) having electrically insulating properties. In the illustrated example, the base coat layer 16 is formed on the substrate 10a, and the drive TFT 11 and the like are provided on the base coat layer 16.

The drive TFT 11 includes the semiconductor layer 11a, the gate electrode 11g, the source electrode 11s, and the drain electrode 11d. The selection TFT 11' includes a semiconductor layer 11a', a gate electrode 11g', a source electrode 11s', and a drain electrode 11d'.

The gate electrode 11g' of the selection TFT 11' is connected to the scanning wiring line GL. The source electrode 11s' of the selection TFT 11' is connected to the signal wiring line SL. The drain electrode 11d' of the selection TFT 11' is connected to the gate electrode 11g of the drive TFT 11 and the capacitance element Cs. The drain electrode 11d of the drive TFT 11 is connected to the power source wiring line CL. The source electrode 11s of the drive TFT 11 is connected to the OLED 50, more specifically, the anode (pixel electrode) 12.

When an ON signal is supplied from the scanning wiring line GL to the gate electrode 11g' of the selection TFT 11', the selection TFT 11' is brought into the ON state, and thus a signal voltage (corresponding to desired luminance of light emitted from the OLED 50) from the signal wiring line SL is applied to the capacitance element Cs and the gate electrode 11g of the drive TFT 11 via the selection TFT 11'. When the drive TFT 11 is brought into the ON state by the signal voltage, a current from the power source wiring line CL flows through the drive TFT 11 to the OLED 50, and then the OLED 50 emits light.

The semiconductor layers 11a and 11a' of the drive TFT 11 and the selection TFT 11' are provided on the base coat layer 16. The semiconductor layers 11a and 11a' are oxide semiconductor layers. The gate insulating layer 17 is formed on the semiconductor layers 11a and 11a'. The gate electrodes 11g and 11g' and the scanning wiring line GL are provided on the gate insulating layer 17. The interlayer insulating layer 18 is formed covering the gate electrode 11g and the like.

The source electrode 11s', the drain electrodes 11d and 11d', the signal wiring lines SL, and the power source wiring line CL are provided on the interlayer insulating layer 18. An opening (contact hole) CHd that exposes a portion of the semiconductor layer 11a of the drive TFT 11 is formed in the interlayer insulating layer 18, and the drain electrode 11d of the drive TFT 11 is connected to the semiconductor layer 11a in the opening CHd. In addition, openings (contact holes) CHs' and CHd' that expose a portion of the semiconductor layer 11a' of the selection TFT 11' are formed in the interlayer insulating layer 18, and the source electrode 11s' and the drain electrode 11d' are connected to the semiconductor layer 11a' in the openings CHs' and CHd', respectively. Further, a sixth contact hole CH6 that exposes a portion of the gate electrode 11g is formed in the interlayer insulating layer 18, and the drain electrode 11d' is connected to the gate electrode 11g in the sixth contact hole CH6.

The anode (pixel electrode) 12 is formed of a transparent conductive material (e.g., ITO). The anode 12 is electrically connected to the drive TFT 11, more particularly, to the source electrode 11s of the drive TFT 11.

The color filter 14 is located between the drive TFT 11 and the anode 12. The color filter 14 of each pixel is, for example, any of a red color filter, a green color filter, and a blue color filter.

The connecting electrode 15 is formed of a transparent conductive material (e.g., ITO). The connecting electrode 15 connects the drive TFT 11 to the pixel electrode 12. In the illustrated example, the source electrode 11s of the drive TFT 11 is integrally formed with the connecting electrode 15. That is, the source electrode 11s is a transparent source electrode formed of a transparent conductive material, and the TFT 11 does not includes a source electrode formed of a metal material.

The color filter 14 includes the first color filter layer (a lower color filter layer) 14a provided on the drive TFT 11 and the second color filter layer (an upper color filter layer) 14b provided on the first color filter layer 14a. That is, the color filter 14 has a layered structure. The first color filter layer 14a and the second color filter layer 14b are color filter layers of substantially the same color.

The first color filter layer 14a includes the first contact hole CH1. In addition, the interlayer insulating layer 18 includes the third contact hole CH3 that exposes a portion of the semiconductor layer 11a continuously with the first contact hole CH1. In the first contact hole CH1 and the third contact hole CH3, the drive TFT 11 is connected to the connecting electrode 15. More specifically, the transparent source electrode 11s integrally formed with the connecting electrode 15 is connected to the semiconductor layer 11a, and the drive TFT 11 and the connecting electrode 15 are connected. The connecting electrode 15 is provided between the first color filter layer 14a and the second color filter layer 14b.

The second color filter layer 14b includes the second contact hole CH2. In the second contact hole CH2, the connecting electrode 15 is connected to the anode 12. The second contact hole CH2 is formed to expose a portion of the connecting electrode 15. The anode 12 is provided on the second color filter layer 14b, and the connecting electrode 15 is connected to the anode 12 in the second contact hole CH2. In the illustrated example, the second contact hole CH2 is located in the pixel opening region.

The organic EL layer 51 is provided on the anode 12, and the cathode (common electrode) 13 is formed on the organic EL layer 51. The cathode 13 is formed of a metal material.

When viewed in the normal direction of the display surface, the first contact hole CH1 and the second contact hole CH2 do not overlap each other. That is, the first contact hole CH1 and the second contact hole CH2 are disposed shifted from each other.

In the organic EL display device 500 of the present embodiment, the color filter 14 of the TFT substrate 10 includes the first color filter layer 14a and the second color filter layer 14b, and when viewed in the normal direction of the display surface, the contact hole (the first contact hole) CH1 of the first color filter layer 14a and the contact hole (the second contact hole) CH2 of the second color filter layer 14b do not overlap each other. Accordingly, a colored layer of the second color filter layer 14b is present within and above the first contact hole CH1, and a colored layer of the lower color filter layer 14a is present below the second contact hole CH2. Accordingly, an uncolored region can be reduced.

In this manner, also in the bottom-emitting organic EL display device 500, since a region that does not contribute to an aperture ratio (ineffective region) can be reduced with the configuration described above, the aperture ratio can be improved.

Oxide Semiconductor

The oxide semiconductor present in the oxide semiconductor layer may be an amorphous oxide semiconductor, or may be a crystalline oxide semiconductor including a crystalline portion. Examples of the crystalline oxide semiconductor include a polycrystalline oxide semiconductor, a microcrystalline oxide semiconductor, and a crystalline oxide semiconductor having a c axis aligned substantially perpendicular to a layer surface.

The oxide semiconductor layer may have a layered structure including two or more layers. In a case where the oxide semiconductor layer includes a layered structure, the oxide semiconductor layer may include an amorphous oxide semiconductor layer and a crystalline oxide semiconductor layer. Alternatively, the oxide semiconductor layer may include a plurality of crystalline oxide semiconductor layers having different crystal structures. In addition, the oxide semiconductor layer may include a plurality of amorphous oxide semiconductor layers. In a case in which an oxide semiconductor layer has a dual-layer structure including an upper layer and a lower layer, an energy gap of the oxide semiconductor included in a layer closer to a gate electrode (the upper layer in a case of a top gate structure) is preferably less than an energy gap of the oxide semiconductor included in a layer farther from the gate electrode (the lower layer in a case of the top gate structure). However, in a case where a difference in the energy gaps between these layers is relatively small, the energy gap of the oxide semiconductor in the layer farther from the gate electrode may be less than the energy gap of the oxide semiconductor in the layer closer to the gate electrode.

Materials, structures, and film formation methods of an amorphous oxide semiconductor and the above-described crystalline oxide semiconductors, a configuration of an oxide semiconductor layer including a layered structure, and the like are described in, for example, JP 2014-007399A. The entire contents of the disclosure of JP 2014-007399A are incorporated herein as reference.

The oxide semiconductor layer may include, for example, at least one metal element selected from In, Ga, and Zn. In embodiments of the present invention, the oxide semiconductor layer includes, for example, an In—Ga—Zn—O-based semiconductor (e.g., an indium gallium zinc oxide). Here, the In—Ga—Zn—O-based semiconductor is a ternary oxide of indium (In), gallium (Ga), and zinc (Zn), and a ratio (composition ratio) of In, Ga, and Zn is not particularly limited. For example, the ratio includes In:Ga:Zn=2:2:1, In:Ga:Zn=1:1:1, or In:Ga:Zn=1:1:2. Such an oxide semiconductor layer can be formed of an oxide semiconductor film including an In—Ga—Zn—O-based semiconductor.

The In—Ga—Zn—O-based semiconductor may be an amorphous semiconductor or may be a crystalline semiconductor. A crystalline In—Ga—Zn—O-based semiconductor in which a c axis is aligned substantially perpendicular to a layer surface is preferable as a crystalline In—Ga—Zn—O-based semiconductor.

Note that a crystal structure of the crystalline In—Ga—Zn—O-based semiconductor is disclosed in, for example, JP 2014-007399A as described above, JP 2012-134475A, JP 2014-209727A, and the like. The entire contents of the disclosure of JP 2012-134475A and JP 2014-209727A are incorporated herein as reference. A TFT including an In—Ga—Zn—O-based semiconductor layer has high mobility (more than 20 times as compared to that of an a-Si TFT) and a low leakage current (less than $\frac{1}{100}$th as compared to that of the a-Si TFT), and thus can be used suitably as a drive TFT (e.g., a TFT included in a drive circuit provided in a periphery of a display region including a plurality of pixels and on the same substrate as that of the display region) and a pixel TFT (TFT provided in a pixel).

In place of the In—Ga—Zn—O-based semiconductor, the oxide semiconductor layer may include another oxide semiconductor. For example, the oxide semiconductor layer may include an In—Sn—Zn—O-based semiconductor (e.g., $In_2O_3$—$SnO_2$—ZnO; InSnZnO). The In—Sn—Zn—O-based semiconductor is a ternary oxide of In (indium), Sn (tin), and Zn (zinc). Alternatively, the oxide semiconductor layer may include an In—Al—Zn—O-based semiconductor, an In—Al—Sn—Zn—O-based semiconductor, a Zn—O-based semiconductor, an In—Zn—O-based semiconductor, a Zn—Ti—O-based semiconductor, a Cd—Ge—O-based semiconductor, a Cd—Pb—O-based semiconductor, a CdO (cadmium oxide), an Mg—Zn—O-based semiconductor, an In—Ga—Sn—O-based semiconductor, an In—Ga—O-based semiconductor, a Zr—In—Zn—O-based semiconductor, an Hf—In—Zn—O-based semiconductor, an Al—Ga—Zn—O-based semiconductor, a Ga—Zn—O-based semiconductor, or an In—Ga—Zn—Sn—O-based semiconductor.

According to an embodiment of the present invention, an aperture ratio of a display device provided with an active matrix substrate including a color filter can be improved. Embodiments of the present invention can be widely used in display devices provided with an active matrix substrate including a color filter, and may be particularly suitably used in high-definition liquid crystal display devices (e.g., liquid crystal display devices for HMD) and organic EL display devices.

While there have been described what are at present considered to be certain embodiments of the invention, it will be understood that various modifications may be made thereto, and it is intended that the appended claim cover all such modifications as fall within the true spirit and scope of the invention.

What is claimed is:

1. A display device comprising:
an active matrix substrate including
a plurality of pixels arrayed in a matrix shape including a plurality of rows and a plurality of columns, and
a plurality of scanning wiring lines extending in a row direction and a plurality of signal wiring lines extending in a column direction,
wherein the active matrix substrate includes, in each of the plurality of pixels,
a TFT including a semiconductor layer, a gate electrode, a source electrode, and a drain electrode,
a pixel electrode formed of a transparent conductive material and electrically connected to the TFT,
a color filter located between the TFT and the pixel electrode, and at least one connecting electrode formed of a transparent conductive material and electrically connecting the TFT to the pixel electrode, the color filter includes a first color filter layer provided on the TFT and including a first contact hole, and a second color filter layer provided on the first color filter layer and including a second contact hole, and the first contact hole and the second contact hole do not overlap with each other when viewed in a normal direction of a display surface.

2. The display device according to claim 1, wherein the at least one connecting electrode is one connecting electrode connecting the TFT to the pixel electrode, in the first contact hole, the TFT is connected to the connecting electrode, and in the second contact hole, the connecting electrode is connected to the pixel electrode.

3. The display device according to claim 2, wherein the drain electrode of the TFT is formed of a metal material, and in the first contact hole, the drain electrode of the TFT is connected to the connecting electrode.

4. The display device according to claim 2, wherein the semiconductor layer of the TFT is an oxide semiconductor layer, the drain electrode of the TFT is a transparent drain electrode integrally formed with the connecting electrode, the active matrix substrate includes an interlayer insulating layer covering the oxide semiconductor layer and the gate electrode, the interlayer insulating layer includes a third contact hole continuous with the first contact hole, and in the third contact hole, the transparent drain electrode is connected to the oxide semiconductor layer.

5. The display device according to claim 4, wherein, when viewed in the normal direction of the display surface, a transparent electrode layer including the transparent drain electrode and the connecting electrode at least partially overlaps one of the plurality of signal wiring lines.

6. The display device according to claim 4, wherein the oxide semiconductor layer includes an In—Ga—Zn—O-based semiconductor.

7. The display device according to claim 6, wherein the In—Ga—Zn—O-based semiconductor includes a crystalline portion.

8. The display device according to claim 1, wherein, in a case where a region surrounded by two adjacent scanning wiring lines of the plurality of scanning wiring lines and two adjacent signal wiring lines of the plurality of signal wiring lines are referred to as a pixel opening region, the second contact hole is located within the pixel opening region.

9. The display device according to claim 8, wherein a thickness of the second color filter layer is less than a thickness of the first color filter layer.

10. The display device according to claim 1, wherein, when viewed in the normal direction of the display surface, the second contact hole at least partially overlaps one of the plurality of scanning wiring lines.

11. The display device according to claim 10, wherein a thickness of the second color filter layer is greater than a thickness of the first color filter layer.

12. The display device according to claim 1, wherein the display device functions as an in-cell touch panel, the active matrix substrate further includes a plurality of sensor wiring lines for a touch panel, the plurality of sensor wiring lines for a touch panel being formed of a metal material and provided between the first color filter layer and the second color filter layer, and when viewed in the normal direction of the display surface, the plurality of sensor wiring lines for a touch panel overlap the plurality of signal wiring lines.

13. The display device according to claim 12, wherein the active matrix substrate further includes a common electrode formed of a transparent conductive material and divided into a plurality of sub-electrodes, and each of the plurality of sensor wiring lines for a touch panel is electrically connected to one of the plurality of sub-electrodes.

14. The display device according to claim 1, wherein the display device is a liquid crystal display device further including a counter substrate facing the active matrix substrate, and a liquid crystal layer provided between the active matrix substrate and the counter substrate.

15. The display device according to claim 1, wherein the display device is an organic EL display device further including an organic EL layer provided on the pixel electrode.

* * * * *